US005727075A

United States Patent [19]

Aoyagi

[11] Patent Number: 5,727,075

[45] Date of Patent: Mar. 10, 1998

[54] MULTIPOINT COMMUNICATION APPARATUS WITH REDUCED NUMBER OF AUDIO DECODERS

[75] Inventor: Yasuo Aoyagi, Tokyo, Japan

[73] Assignee: Oki Electric Industry Co., Ltd., Tokyo, Japan

[21] Appl. No.: 610,856

[22] Filed: Mar. 5, 1996

[30] Foreign Application Priority Data

Apr. 17, 1995 [JP] Japan ........................ 7-091153

[51] Int. Cl.[6] ........................ H03G 7/00

[52] U.S. Cl. ........................ 381/106; 333/14; 381/104

[58] Field of Search ........................ 381/106, 104, 381/105, 107; 370/260; 375/208; 333/14

[56] References Cited

U.S. PATENT DOCUMENTS 4,317,204 2/1982 Gordy ........................ 375/208

4,535,471 8/1985 Kuroda ........................ 381/106

5,570,363 10/1996 Holm ........................ 370/260

5,586,193 12/1996 Ichise ........................ 381/106

5,633,939 5/1997 Kitani et al. ........................ 381/106

*Primary Examiner*—Curtis Kuntz

*Assistant Examiner*—Xu Mei

*Attorney, Agent, or Firm*—Spencer & Frank

[57] ABSTRACT

A multipoint communication apparatus receives a set of audio signals encoded by gain-shape vector quantization. A gain detector in the multipoint communication apparatus dynamically selects a subset of these audio signals on the basis of gain indices contained in the audio signals. Only the selected subset of audio signals are decoded. The decoded signals are combined to produce an audio output signal.

10 Claims, 4 Drawing Sheets

MULTIPOINT COMMUNICATION APPARATUS WITH REDUCED NUMBER OF AUDIO DECODERS

BACKGROUND OF THE INVENTION

The present invention relates to a multipoint communication apparatus such as a teleconferencing apparatus or videoconferencing apparatus, and more particularly to the audio decoding part of such an apparatus.

Teleconferencing and videoconferencing systems bring participants at diverse sites together in a single conference, in which each site receives audio signals from all of the other participating sites simultaneously. If all these audio signals were to be reproduced, the conference participants would be distracted by much extraneous noise, so it is common to reproduce only the audio signals from a selected subset of sites. In one scheme, at each site, a fixed number M of other sites currently having the highest levels of audio activity are selected, and their M audio signals are combined to create an output audio signal.

To conserve bandwidth on communication channels, many recent teleconferencing or videoconferencing systems transmit audio signals in a compressed, encoded form. Vector quantization, for example, can be used to transmit audio signals in a fraction of the bandwidth that would be required by standard companding pulse-code modulation (PCM). Conventional methods of selecting the M most active audio signals fail to work, however, when the audio signals are compressively encoded. Conventional multipoint communication apparatus of the type employing audio compression accordingly decodes all of the incoming audio signals, so that their audio levels can be compared to select the M most active signals.

A disadvantage of this system is that a separate decoder is required for each communication channel. The number of deciders in the multipoint communication apparatus thus limits conferences to a certain maximum number of participating sites, which is inconvenient. The decoders are moreover expensive and space-consuming, each typically having its own digital signal processor (DSP) and memory, so providing enough decoders to handle large conferences makes the multipoint communication apparatus unduly expensive.

SUMMARY OF THE INVENTION

It is accordingly an object of the present invention to enable a limited number of audio decoders in a multipoint communication apparatus to handle an unlimited number of conference participants.

Another object of the invention is to reduce the cost of multipoint communication apparatus.

A further object of the invention is to reduce the size of multipoint communication apparatus.

The invented multipoint communication apparatus operates in a gain-shape vector quantization environment in which the incoming, encoded audio signals consist of codewords, each having a gain index and a shape index. A gain detector in the multipoint communication apparatus monitors the gain indices of the codewords received via different channels and selects a set of M channels on the basis of the gain indices. (M is a fixed positive integer.) A channel selector selects the codewords received via the M channels selected by the gain detector. The codewords selected by the channel selector are decoded by a set of M decoders to produce respective outputs, which are added by an adder to create an audio output signal. A set of M decoders thus suffices for a conference of any size.

DETAILED DESCRIPTION OF THE INVENTION

An embodiment of the invention will be described with reference to the attached illustrative drawings.

Figure 1:
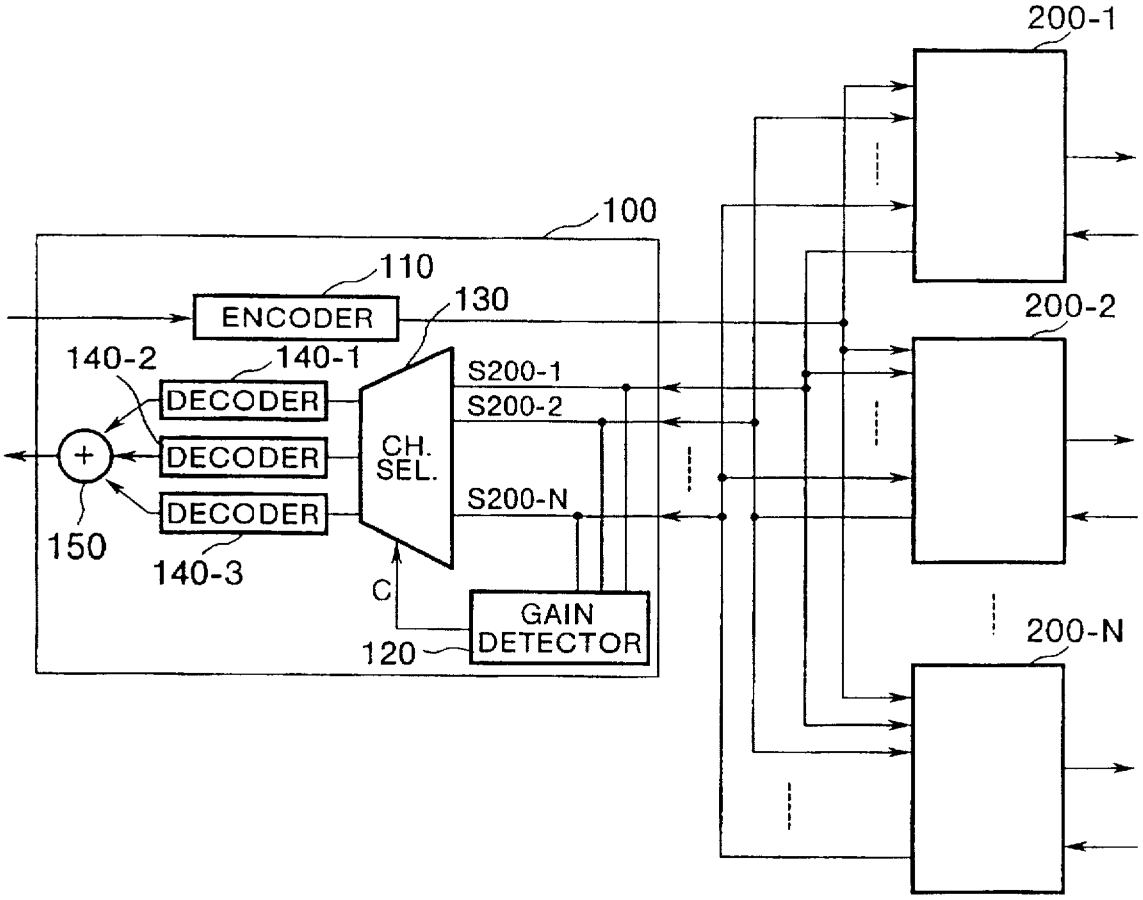
FIG. 1 is a block diagram of the invented multipoint communication apparatus.

Referring to FIG. 1, the invented multipoint communication apparatus 100 communicates with N other, similar multipoint communication apparatuses 200-1 to 200-N located at other sites. (N is an integer greater than one.) The multipoint communication apparatuses are interconnected by communication channels as shown, so that each multipoint communication apparatus transmits signals to and receives signals from all of the other multipoint communication apparatuses. The communication channels may be dedicated private channels, or switched public channels, such as channels provided by an integrated services digital network (ISDN).

Figure 2:
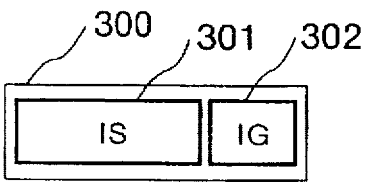
FIG. 2 illustrates the gain-shape codeword format.

The multipoint communication apparatus 100 has an encoder 110 that receives a digitized audio signal and outputs corresponding codewords. FIG. 2 shows the format of these codewords. Each codeword 300 comprises a shape index (IS) 301 and a gain index (IG) 302. The shape index 301 designates an entry in a dictionary of standard vectors, each representing a short (e.g. one-millisecond) segment of an audio signal waveform. In vector quantization, the term "vector" is used to mean a digitized waveform segment; this usage will be followed below. The gain index 302 designates a positive or negative constant by which the signal values in the segment are to be multiplied.

In the following description it will be assumed that the shape index 301 has a fixed length of seven bits and the gain index 302 has a fixed length of three bits, giving each codeword 300 a fixed length of ten bits. The invention is not restricted to these particular bit lengths, however. For example, the gain index 302 may have a length of four or five bits instead of three bits.

Figure 3:
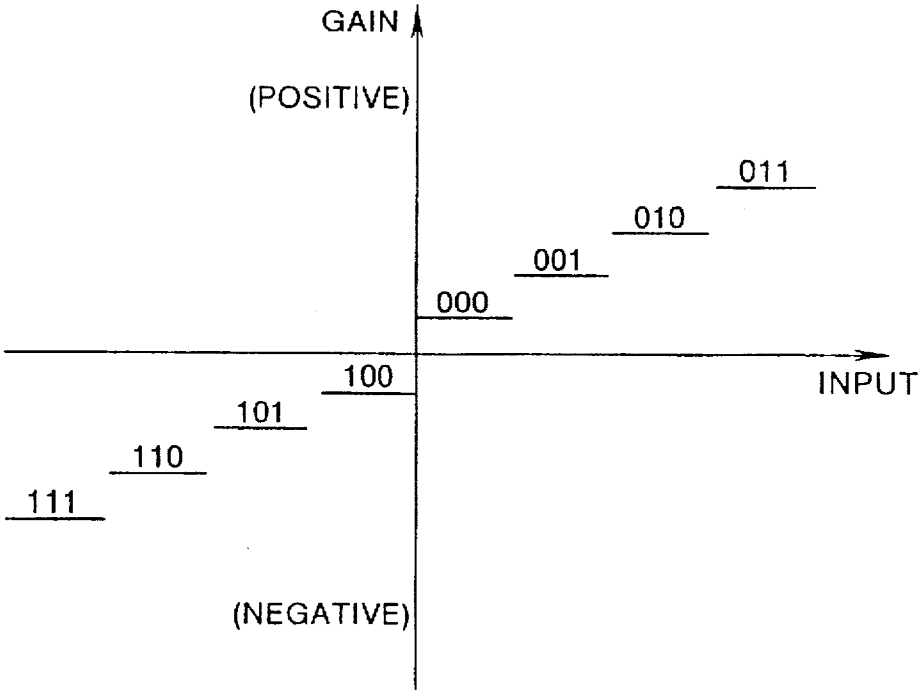
FIG. 3 illustrates the coding of the gain index.

FIG. 3 shows a preferred coding scheme for a three-bit gain index. The horizontal axis indicates the magnitude or power of an input waveform segment or vector. The vertical axis indicates the gain value by which the standard vector selected from the dictionary is multiplied to obtain a vector as close as possible to the input vector. Negative gain values invert the standard vector, e.g. converting a positive-going pulse into a negative-going pulse. The gain indices are shown as three-bit values above line segments positioned at the corresponding gain levels. The most significant bit (MSB) designates the positive or negative sign of the gain. The two least significant bits designate the absolute value |IG| of the gain.

The invention is not restricted to the gain coding scheme shown in FIG. 3, but it is advantageous if the gain index can be separated into a sign bit and one or more absolute-value bits.

Referring again to FIG. 1, the other multipoint communication apparatuses 200-1 to 200-N have similar encoders that output encoded audio signals S200-1 to S200-N. The multipoint communication apparatus 100 thus receives encoded audio signals on N channels. These N encoded audio signals S200-1, . . . , S200-N are provided to a gain detector 120 and a channel selector 130 in the multipoint communication apparatus 100. The gain detector 120 monitors the gain indices in these N signals, selects M of the N channels, and controls the channel selector 130. M is a fixed positive integer less than N. In the present embodiment M will be equal to three, although the invention is of course not limited to this value. The channel selector 130 selects the data (codewords) from the M signal channels selected by the gain detector 120.

The encoded signal data selected by the channel selector 130 are provided to a set of M decoders 140 (identified in the drawing as 140-1, 140-2, and 140-3). The decoders 140 produce M decoded digital audio signals, which are summed by an adder 150 to produce an output audio signal.

Figure 4:
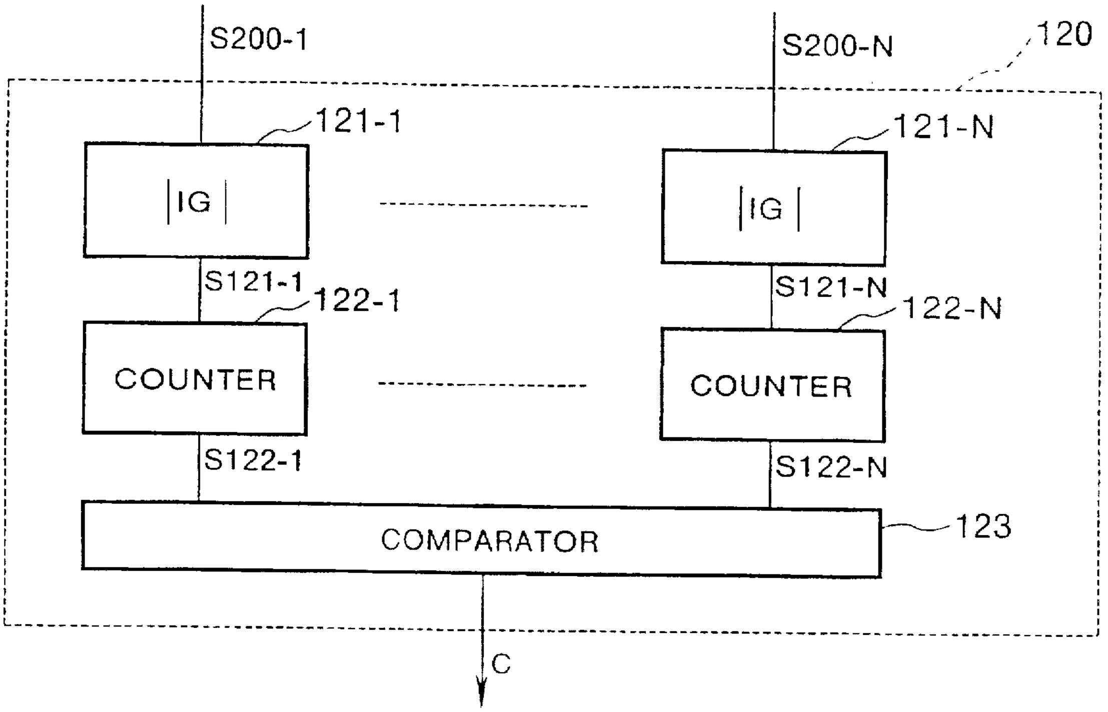
FIG. 4 is a more detailed block diagram of the gain detector in FIG. 1.

FIG. 4 shows the structure of the gain detector 120 in more detail. For each of the N received signals S200-k (k=1 to N), the gain detector 120 has an absolute gain extractor 121-k that extracts the absolute gain value ||G|| designated by the gain index of each codeword. With the codeword format illustrated in FIGS. 2 and 3, the absolute gain extractor 121-k can simply take the two least significant bits of each ten-bit codeword. The resulting absolute gain signal S121-k is provided to a counter 122-k which increments according to the absolute gain in a manner to be described later. At certain intervals the resulting count values S122-k (k=1 to N) are supplied to a comparator 123, which creates a control signal C selecting M of the signal channels.

Next the operation will be described.

When the user of the multipoint communication apparatus 100 speaks, his voice is picked up by a microphone (not visible), sampled at a certain rate, and converted to digital sample values by an analog-to-digital converter (also not visible). The resulting digital audio signal is a linear PCM signal, which is supplied to the encoder 110. A vector in this signal is a group of a certain number of consecutive sample values, representing a waveform segment of a certain length. The encoder 110 compares each input vector with the standard vectors in the above-mentioned dictionary, and selects shape and gain indices that produce the best match to the input vector.

Figure 5:
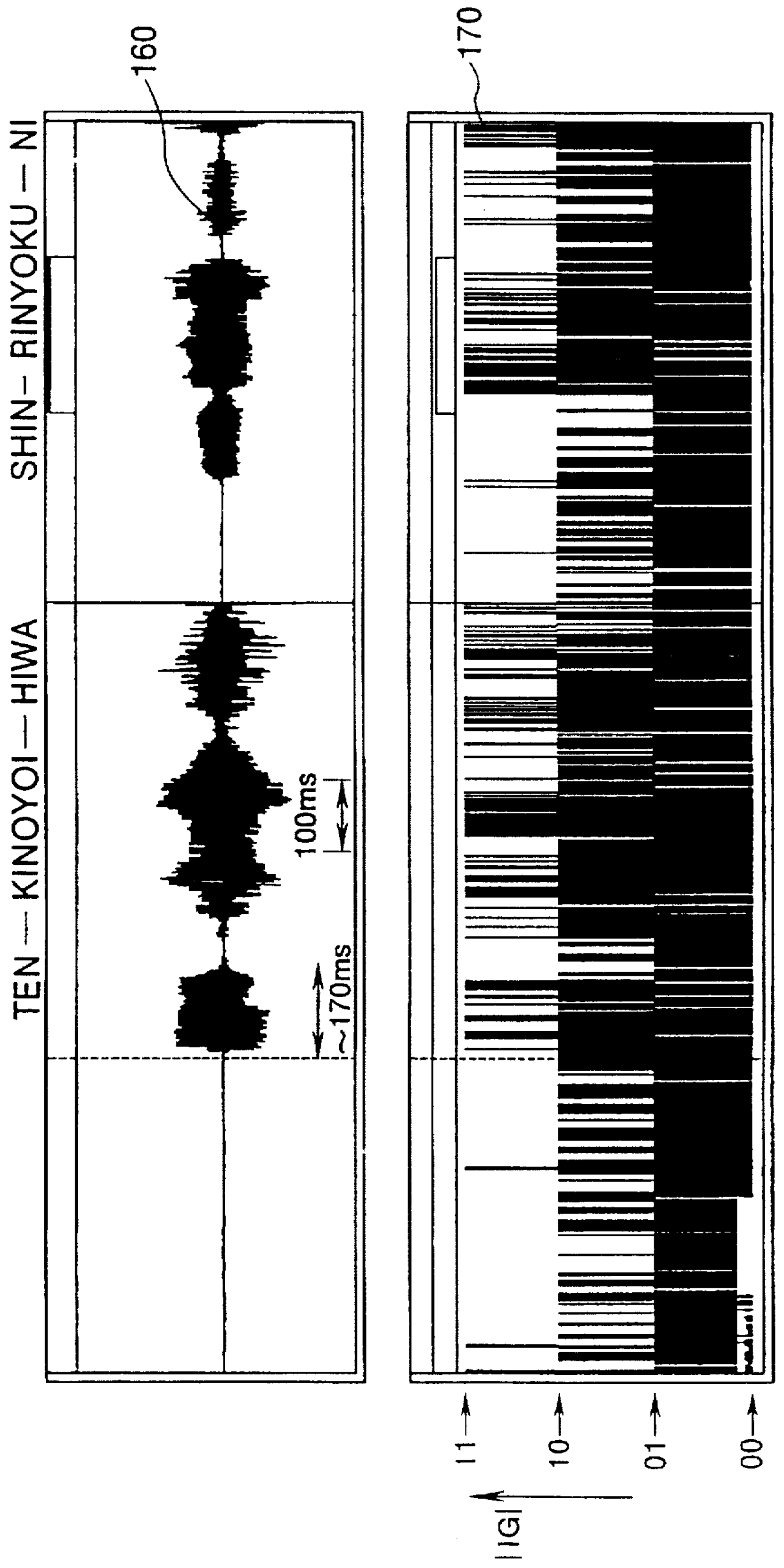
FIG. 5 illustrates absolute values of the gain index for a spoken utterance.

FIG. 5 shows the waveform 160 of a typical audio signal input to the encoder 110, and the resulting absolute gain indices 170. The waveform 160 represents the Japanese utterance "tenki no yol hi wa shinrinyoku ni . . ." ( . . . refresh oneself in the forest on fine days). As this waveform illustrates, the length of a typical syllable is on the order of a tenth of a second, or one hundred milliseconds (100 ms).

The encoder 110 produces codewords at the rate of, for example, about one thousand codewords per second (one per millisecond). From FIG. 5 it can be seen that codewords designating the maximum absolute gain value (||G||='11') are rarely produced during intervals of silence, but are frequently produced during intervals of speech. This also applies, of course, to the signals S200-1 to S200-N received from the other multipoint communication apparatuses.

The gain detector 120 is accordingly adapted to operate as follows. Each counter 122-k in FIG. 4 counts the number of codewords with the maximum absolute gain value (||G||='11') during an approximately 100-ms interval. At the end of this interval, the comparator 123 compares the counts, selects the M channels with the highest count values, and outputs a control signal C commanding the channel selector 130 to select the codewords received on those M channels. At the same time, the N counters 122-k (k=1 to N) are reset to start counting from zero in the next approximately 100-ms interval. The control signal C is thus updated dynamically at intervals of approximately 100 ms.

When the same count is obtained on several channels, it may happen that the set of M channels with the highest counts is not uniquely determined. That would be the case, for example, when M is three and the highest counts are thirty, twenty, ten, ten, . . . . In such cases the comparator 123 preferentially selects those channels that were selected in the preceding interval, to avoid needless shifting of the channel selections.

This rule can be modified to cover the case of approximate equality. For example, the comparator 123 can be adapted to change from selecting a first channel to selecting a second channel in place of the first channel only if the count value of the second channel exceeds the count value of the first channel by at least a certain fixed amount. This modified rule avoids switching channels in response to minor changes in voice level or background noise. When more than M people are currently speaking, the modified rule gives preference to the channels on which people started speaking first. When fewer than M are currently speaking, the modified rule gives preference to the channels on which people last stopped speaking.

The channel selector 130 provides the codewords on the M channels selected by the gain detector 120 to the M decoders 140. Each decoder 140-k (k=1 to M) comprises a digital signal processor that selects standard vectors from the above-mentioned dictionary according to the shape indices 131 in the received codewords, multiplies these standard vectors by the gain values designated by the gain indices 132, and outputs the resulting vectors to the adder 150. These vectors are segments of linear PCM signals, which the adder 150 adds to produce a digital output audio signal. The output audio signal is fed through a digital-to-analog converter (not visible) to a loudspeaker or headset (also not visible) to produce an audible output signal.

Next some variations of the counting scheme used for selecting channels will be described.

Instead of counting the number of times the maximum absolute gain index is received, the gain detector 120 can count the number of times the absolute gain exceeds a certain threshold value. In the preceding embodiment this threshold could be set at the binary value '01' for example, so that absolute gains of '10' and '11' are counted.

Alternatively, instead of counting the number of times the absolute gain exceeds a certain threshold, the counters 122-k can be adapted to add the absolute gain values to their count values, to produce a cumulative sum of the absolute gain over a given interval. The comparator 123 selects the M channels with the highest cumulative sums.

On channels on which no one is speaking, the gain tends to fluctuate rapidly between small positive and negative values; such positive-negative fluctuations are found to occur less frequently when speech is present. Accordingly, the gain detector 120 can also be adapted to monitor the sign bit of the gain index, count the number of transitions of the sign bit (zero crossings), and select the M channels with the lowest transition counts.

With any of these counting schemes, the invented multipoint communication apparatus requires only M decoders to handle an arbitrary number N of conference channels. This makes the invented multipoint communication apparatus more compact and less expensive than conventional apparatus requiring N decoders. Moreover, if the number of channels is increased, it is not necessary to retrofit additional decoders 140, which are large and costly; it suffices to add more absolute gain extractors 121 and counters 122, which are small and cheap.

Although FIG. 4 shows N separate counters 122-1, . . . , 122-N, it is also possible for a single counter or processor to maintain N separate count values in a high-speed memory device. Similarly, a single absolute gain extractor can extract absolute gain values from N signal channels. If these modifications are made, the number of channels N can be increased simply by providing connections for the additional channels, without adding any more counters or extractors.

Those skilled in the art will recognize that various further modifications can be made within the scope of the invention as claimed below.

What is claimed is:

1. A multipoint communication apparatus for receiving and decoding audio codewords transmitted from a plurality of other multipoint communication apparatuses via a corresponding plurality of channels, said audio codewords containing respective gain indices and shape indices, to create an audio output signal, comprising:

a gain detector for receiving said audio codewords, monitoring the gain indices contained therein, and dynamically selecting a set of M channels among said plurality of channels, responsive to said gain indices, where M is a fixed positive integer;

a channel selector coupled to said gain detector, for selecting the audio codewords received on the M channels selected by said gain detector;

a set of M decoders coupled to said channel selector, for decoding the audio codewords selected by said channel selector to produce respective outputs; and an adder coupled to said decoders, for adding the outputs of said M decoders to create said audio output signal.

2. The multipoint communication apparatus of claim 1, wherein said gain detector counts codewords, among said audio codewords, having gain indices designating absolute gain values exceeding a predetermined threshold, maintains a separate count of such codewords for each channel among said plurality of channels over a certain interval of time, and selects M channels for which highest counts are obtained.

3. The multipoint communication apparatus of claim 2 wherein, in case of identical counts, said gain detector preferentially selects channels selected in an immediately preceding interval of time.

4. The multipoint communication apparatus of claim 2, wherein said gain detector switches from selecting a first channel to selecting a second channel in place of said first channel only when the count of said second channel exceeds the count of said first channel by at least a certain amount.

5. The multipoint communication apparatus of claim 1, wherein said gain detector sums absolute gain values designated by said gain indices, maintains a separate cumulative sum of said absolute gain values for each channel among said plurality of channels over a certain interval of time, and selects M channels for which highest cumulative sums are obtained.

6. The multipoint communication apparatus of claim 5 wherein, in case of identical cumulative sums, said gain detector preferentially selects channels selected in an immediately preceding interval of time.

7. The multipoint communication apparatus of claim 5, wherein said gain detector switches from selecting a first channel to selecting a second channel in place of said first channel only when the cumulative sum of said second channel exceeds the cumulative sum of said first channel by at least a certain amount.

8. The multipoint communication apparatus of claim 1, wherein said gain detector counts transitions between positive and negative values designated by said gain indices, maintains a separate count of said transitions for each channel among said plurality of channels over a certain interval of time, and selects M channels for which lowest counts are obtained.

9. The multipoint communication apparatus of claim 8 wherein, in case of identical counts, said gain detector preferentially selects channels selected in an immediately preceding interval of time.

10. The multipoint communication apparatus of claim 8, wherein said gain detector switches from selecting a first channel to selecting a second channel in place of said first channel only when the count of said first channel exceeds the count of said second channel by at least a certain amount.

* * * * *